US010775860B2

United States Patent
Armes et al.

(10) Patent No.: US 10,775,860 B2
(45) Date of Patent: Sep. 15, 2020

(54) BASE MANAGEMENT CONTROLLER INTERFACE

(71) Applicant: HEWLETT PACKARD ENTERPRISE DEVELOPMENT LP, Houston, TX (US)

(72) Inventors: James Lee Armes, Ft. Collins, CO (US); John Norton, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 172 days.

(21) Appl. No.: 15/973,148

(22) Filed: May 7, 2018

(65) Prior Publication Data
US 2019/0339754 A1 Nov. 7, 2019

(51) Int. Cl.
*G06F 1/20* (2006.01)
*G06F 1/26* (2006.01)
*G05B 19/042* (2006.01)

(52) U.S. Cl.
CPC ........... *G06F 1/206* (2013.01); *G05B 19/042* (2013.01); *G06F 1/26* (2013.01); *G05B 2219/21156* (2013.01); *G06F 2200/201* (2013.01); *Y02D 10/151* (2018.01); *Y02D 10/16* (2018.01)

(58) Field of Classification Search
CPC ... G06F 1/20; G06F 1/206; G06F 1/26; G06F 2200/201; G05B 19/042; G05B 2219/21156; Y02D 10/00; Y02D 10/10; Y02D 10/11; Y02D 10/12; Y02D 10/15; Y02D 10/151; Y02D 10/16; Y02D 10/17; Y02D 10/20; Y02D 10/30; Y02D 10/34
See application file for complete search history.

(56) References Cited

U.S. PATENT DOCUMENTS

| 7,318,322 | B2 * | 1/2008 | Ota | H05K 7/20781 |
| | | | | 62/259.2 |
| 7,783,903 | B2 * | 8/2010 | Piazza | G06F 1/206 |
| | | | | 713/300 |
| 9,313,930 | B2 * | 4/2016 | Goth | H05K 7/20772 |
| 9,313,931 | B2 * | 4/2016 | Goth | H05K 7/20772 |
| 9,326,429 | B2 | 4/2016 | Chainer et al. | |
| 9,448,544 | B2 * | 9/2016 | Slessman | G05B 13/02 |
| 9,696,235 | B2 | 7/2017 | Alshinnawi et al. | |
| 9,709,965 | B2 * | 7/2017 | Slessman | G05B 13/02 |
| 9,791,837 | B2 * | 10/2017 | Slessman | G05B 13/02 |
| 10,064,314 | B2 * | 8/2018 | Shelnutt | G05B 15/02 |
| 10,238,011 | B1 * | 3/2019 | Cui | H05K 7/20781 |
| 10,254,720 | B2 * | 4/2019 | Slessman | G05B 13/02 |
| 2007/0213881 | A1 | 9/2007 | Belady et al. | |

(Continued)

OTHER PUBLICATIONS

Nils Meyer et al., "iDataCool: HPC with Hot-WaterCooling and Energy Reuse," Sep. 19, 2013, pp. 1-12.

*Primary Examiner* — Crystal J Barnes-Bullock
(74) *Attorney, Agent, or Firm* — Hewlett Packard Enterprise Patent Department

(57) ABSTRACT

An example base management controller interface is provided herein. The base management controller interface includes a power monitoring interface, a temperature interface, and a flow control interface. The power monitoring interface is connected to a management software to distribute and monitor additional power to a host server. The temperature interface to monitor a temperature of the host server. The flow control interface to control a flow rate of liquid in a liquid cooling manifold.

6 Claims, 5 Drawing Sheets

(56) References Cited

U.S. PATENT DOCUMENTS

| | | |
|---|---|---|
| 2013/0073096 A1 | 3/2013 | Brey et al. |
| 2013/0205822 A1* | 8/2013 | Heiland .................. F25D 31/00 62/259.2 |
| 2017/0290202 A1* | 10/2017 | Shah .................. H05K 7/20781 |

* cited by examiner

BASE MANAGEMENT CONTROLLER INTERFACE

BACKGROUND

Electronic devices have power and temperature requirements. Power demand and server density for electronic devices continues to increase. Solutions that are robust and cost effective are in demand.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

DETAILED DESCRIPTION

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

Electronic system designs balance conflicts between power density, spatial layout, temperature requirements, acoustic noise, and other factors on the electronic devices. Server density continues to increase and liquid cooling solutions are an effective and cost-effective way to adequately cool intra-server devices. A liquid cooling solution that can control liquid flow down to the device level in existing and future form factors, distribute and monitor additional power, and interface with the base management controller of the host server are provided herein as an example solution.

In examples, a base management controller interface is provided. The base management controller interface is connected to a base management controller. The base management controller interface includes a power monitoring interface, a temperature interface, and a flow control interface. The power monitoring interface is connected to a management software to distribute and monitor additional power to a host server. The temperature interface to monitor a temperature of the host server. The flow control interface to control a flow rate of liquid in a liquid cooling manifold.

Figure 1:
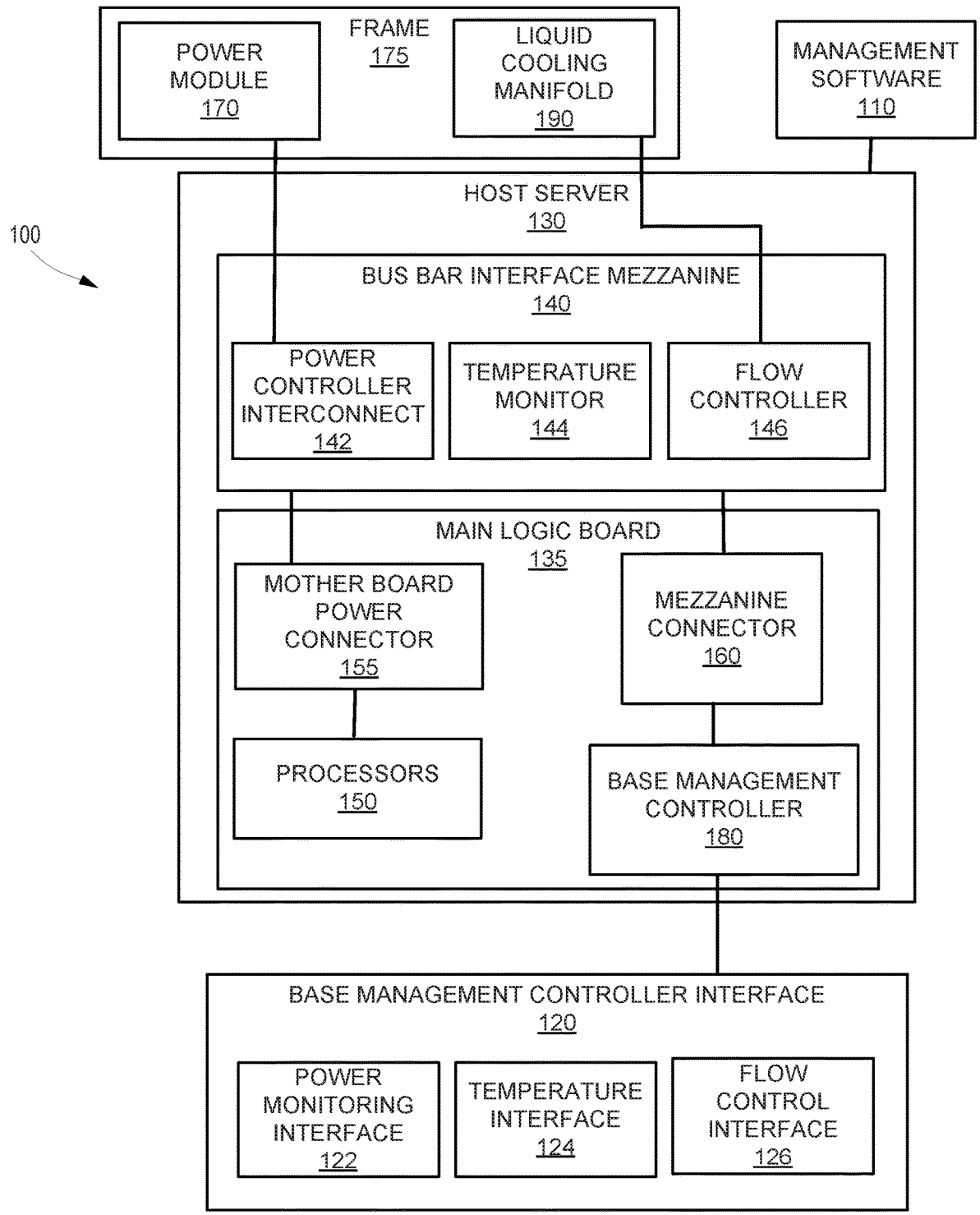
FIG. 1 illustrates a block diagram of a system including a base management controller interface according to an example.

FIG. 1 illustrates a block diagram of a system 100 including a base management controller interface 120 according to an example. The system 100 includes a base management controller interface 120, a mezzanine connector 160, and a bus bar interface mezzanine 140. The base management controller interface 120 is connected to a base management controller 180. The base management controller interface 120 includes a power monitoring interface 122, a temperature interface 124, and a flow control interface 126. The power monitoring interface 122 is connected to a management software 110 to distribute and monitor additional power to a host server 130. The management software 110 may be external to the host server 130. The temperature interface 124 monitors a temperature of the host server 130. The flow control interface 126 controls a flow rate of liquid from a liquid cooling manifold. The flow control interface 126 may also be connected to a hot plug connection to the liquid cooling manifold 190. The base management controller 180 may also be connected to a frame 175 with a power module 170 and the liquid cooling manifold 190.

The mezzanine connector 160 connects to the bus bar interface mezzanine 140 and the base management controller 180. The base management controller 180 manages power, temperature and liquid flow to at least two electronic components. The bus bar interface mezzanine 140 also connects to a set of processors 150. The bus bar interface mezzanine 140 includes a power controller interconnect 142, a temperature monitor 144, and a flow controller 146. The power controller interconnect 142 connects to a plurality of power supplies, for example, via the power module 170, and a main logic board 135. The power monitoring interface 142 manages the plurality of power supplies. The temperature monitor 144 measures temperatures of the processors 150. The flow controller 146 is connected to a supply line and a return line to manage the flow from the supply line and to the return line, for example, via the liquid cooling manifold 190.

The bus bar interface mezzanine 140 may also be connected to the main logic board 135 that includes the processors 150, a mother board power connector 155, the mezzanine connector 160, and the base management controller 180. The mother board power connector 155 connects the power controller interconnect 142 to the processors 150.

For example, the bus bar interface mezzanine 140, the mezzanine connector 160, the base management controller 180, and the set of processors 150 may also be present on the host server 130. The system 100 integrates the base management controller interface 120 with the base manage controller 180 and distributes and monitors additional power while managing temperature requirements. The system 100 may be scaled to rack level using a set of sensors at each processor of the set of processors 150.

Liquid cooling may be used in various ways in this system. For example, the liquid cooling manifold 190 may provide liquid to at least two of the processors 150. The liquid cooling manifold 190 may also provide liquid to the set of processors in parallel with independent flow control through the flow control interface 126. The flow rate of liquid may be controlled using a variable flow valve that includes at least three flow rates and the flow to each processor 150 may be controlled independently.

Figure 2:
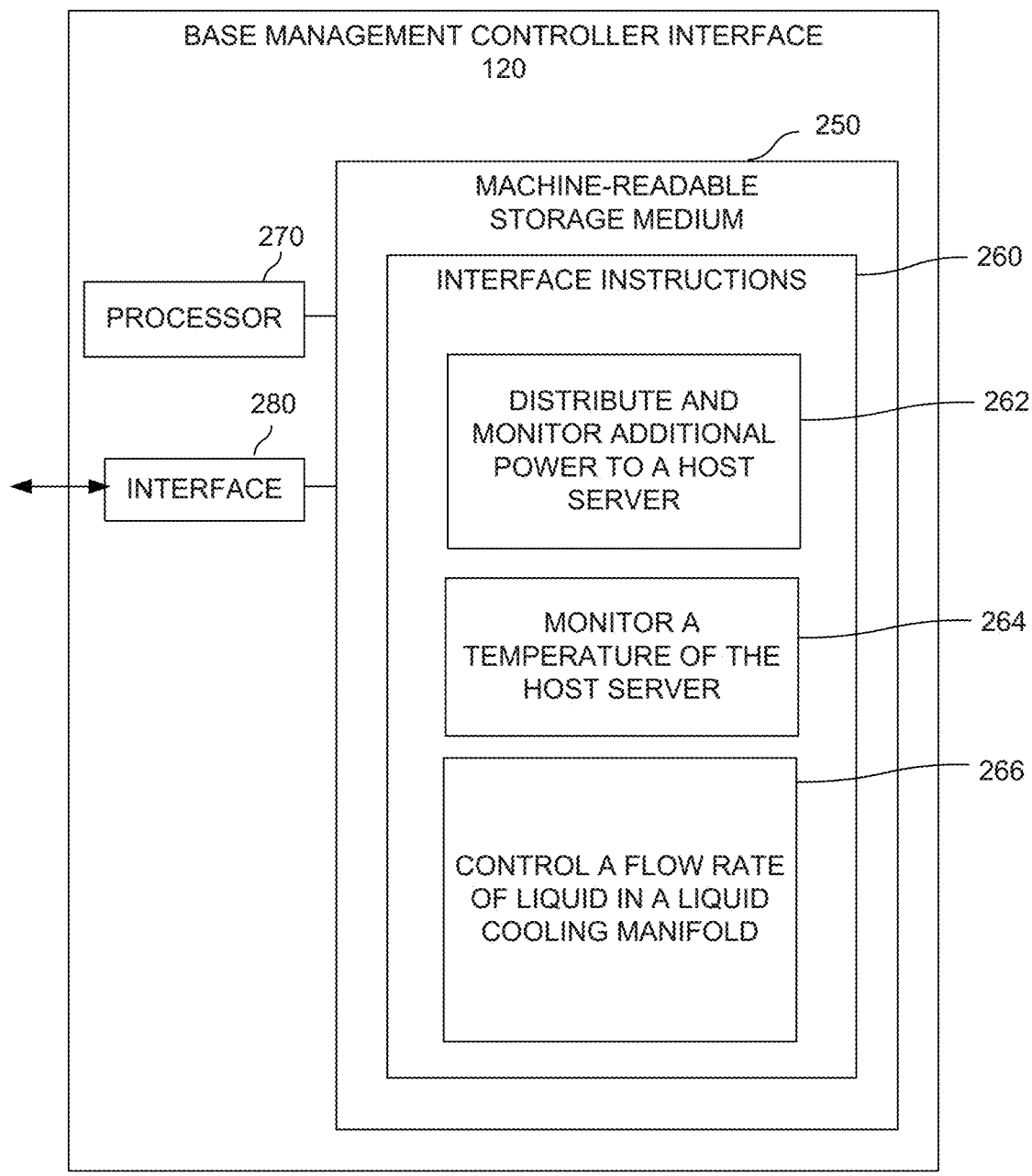
FIGS. 2-3 illustrate block diagrams of a base management controller interface according to examples.
Figure 3:
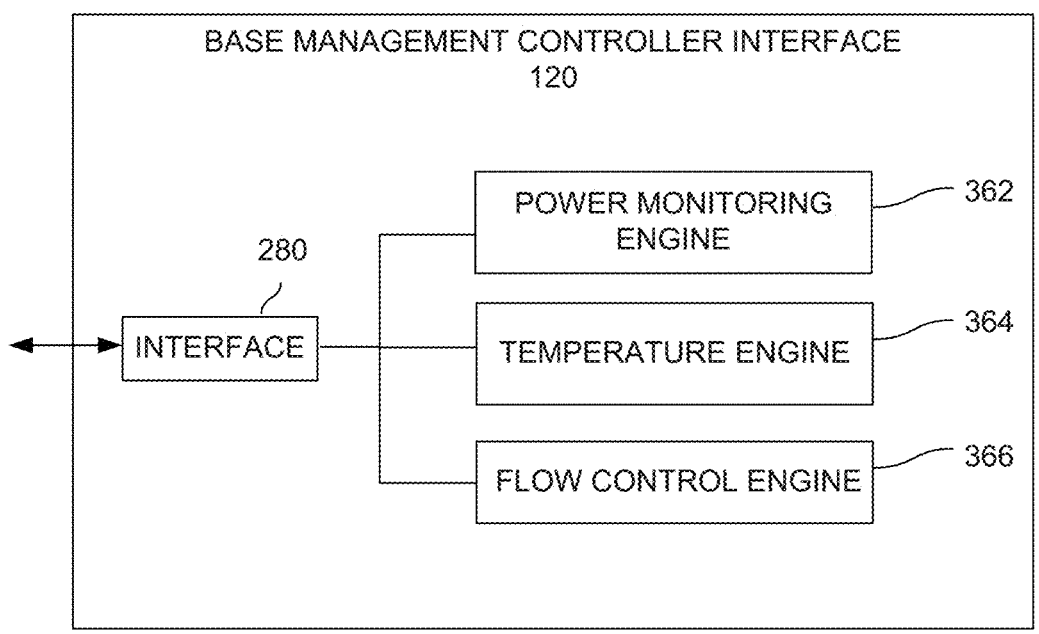

FIGS. 2-3 illustrate block diagrams of a base management controller interface according to examples. Referring to FIG. 2, a base management controller interface 120 is illustrated. Base management controller interface 120 may be implemented in various ways. For example, base management controller interface 120 may be a special purpose computer, a server, a mainframe computer, a computing device executing instructions that receive and process information and aggregates compute, storage, and fabric resources. In the example shown in FIG. 2, base management controller interface 120 may include a machine-readable storage medium 250, a processor 270, a management switch 180, and an interface 280.

Processor 270 may be at least one processing unit (CPU), microprocessor, and/or another hardware device to execute instructions to perform operations. For example, processor 270 may fetch, decode, and execute interface instructions 260 (e.g., instructions 262, 264, and/or 266) stored in machine-readable storage medium 250 to perform operations related to examples provided herein.

Interface 280 may be any device that facilitates the transfer of information between base management controller interface 120 and a base management controller 180. In some examples, interface 280 may allow base management controller interface 120 to receive and send data to and from the host server 130 via the base management controller 180.

Machine-readable storage medium 250 may be any electronic, magnetic, optical, or other physical storage device that stores executable instructions. Thus, machine-readable storage medium 250 may be, for example, memory, a storage drive, an optical disc, and/or the like. In some implementations, machine-readable storage medium 250 may be non-transitory, such as a non-transitory computer-readable storage medium, where the term "non-transitory" does not encompass transitory propagating signals. Machine-readable storage medium 250 may be encoded with instructions that, when executed by processor 270, perform operations consistent with the examples herein. For example, machine-readable storage medium 250 may include instructions that perform operations that manage systems with base management controller interfaces. In the example shown in FIG. 2, the machine-readable storage medium 250 may be a memory resource that stores instructions that when executed cause a processing resource, such as processor 270 to implement a system with base management controller interfaces. The instructions include interface instructions 260, such as instructions 262, 264, 266.

Figure 4:
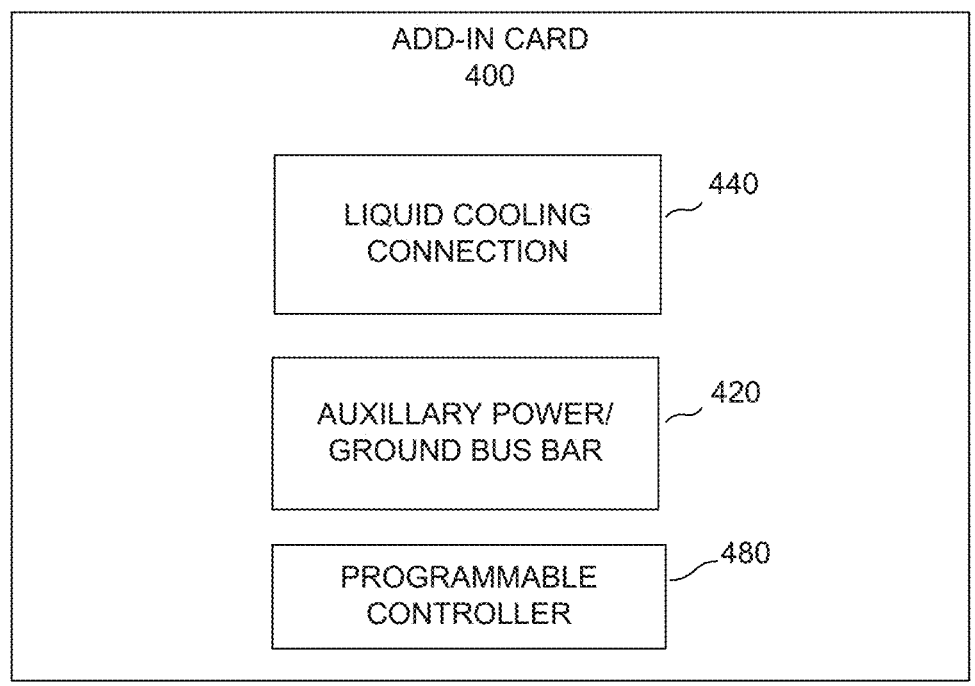
FIG. 4 illustrates a block diagram of an add-in card according to an example.
Figure 5:
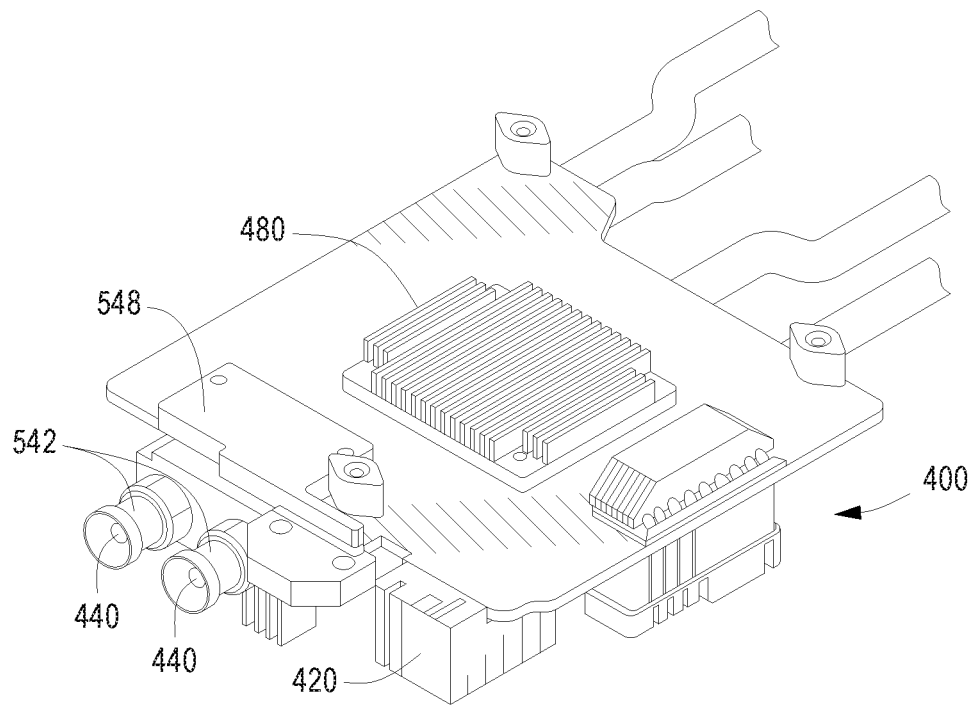
FIGS. 5-6 illustrate top and bottom views of an add-in card of FIG. 4 according to examples.

Instructions 262 may function to distribute and monitor power. For example, when instructions 262 are executed by processor 270, instructions 262 may cause processor 270 of base management controller interface 120, and/or another processor to distribute and monitor power to a host server. Instructions 264 may also function to monitor temperatures of electronic devices. For example, when instructions 264 are executed by processor 270, instructions 264 may cause processor 270 of base management controller interface 120, and/or another processor to monitor a temperature of the host server. Instructions 266 may function to control a flow rate of liquid. For example, when instructions 264 are executed by processor 270, instructions 266 may cause processor 270 of base management controller interface 120, and/or another processor to control a flow rate of liquid in a liquid cooling manifold. Examples of the devices to distribute and monitor power, monitor temperature, and control a flow rate are illustrated in FIGS. 4-5.

Referring to FIG. 3, base management controller interface 120 is illustrated to include a power monitoring engine 362, a temperature engine 364, and a flow control engine 366. In certain aspects, base management controller interface 120 may correspond to base management controller interface 120 of FIGS. 1-2. Base management controller interface 120 may be implemented in various ways. For example, base management controller interface 120 may be a computing system and/or any other suitable component or collection of components that provide a base management controller interface 120.

Engines 362, 364, and 366 include hardware and/or combinations of hardware and programming to perform functions provided herein. Moreover, the modules (not shown) can include programming functions and/or combinations of programming functions to be executed by hardware as provided herein. For example, the instructions for the engines may be processor-executable instructions stored on a non-transitory machine-readable storage medium and the hardware for the engines may include a processor to execute those instructions. In some examples, the functionality of engines 362, 364, and 366 may correspond to operations performed by base management controller interface 120 of FIGS. 1-2, such as operations performed when interface instructions 260 are executed by processor 270. When discussing the engines and modules, it is noted that functionality attributed to an engine can also be attributed to the corresponding module and vice versa. Moreover, functionality attributed to a particular module and/or engine may also be implemented using another module and/or engine.

In FIG. 3, power monitoring engine 362 may represent a combination of hardware and instructions that perform operations similar to those performed when processor 270 executes instructions 262. Similarly, temperature engine 364 may represent a combination of hardware and instructions that perform operations similar to those performed when processor 270 executes instructions 264, and flow control engine 366 may represent a combination of hardware and instructions that perform operations similar to those performed when processor 270 executes instructions 266.

FIG. 4 illustrates a block diagram of an add-in card 400 according to an example. The add-in card 400 includes a liquid cooling connection 440, an auxiliary power/ground bus bar 420, and a programmable controller 480. The liquid cooling connection 440 connects to a liquid cooling manifold. The auxiliary power/ground bus bar connection 420 connects to a bus bar and provides power to a node. The programmable controller 480 interfaces with the liquid cooling connection to adjust the temperature and flow of the fluid. The flow of the fluid is controlled at a variable rate, opposed to on and off. Moreover, the flow to each processor may be regulated independent of the other processor(s). The add-in card 400 provides for blade level monitoring and management within an existing mezzanine card form factor, using the add-in card.

Figure 6:
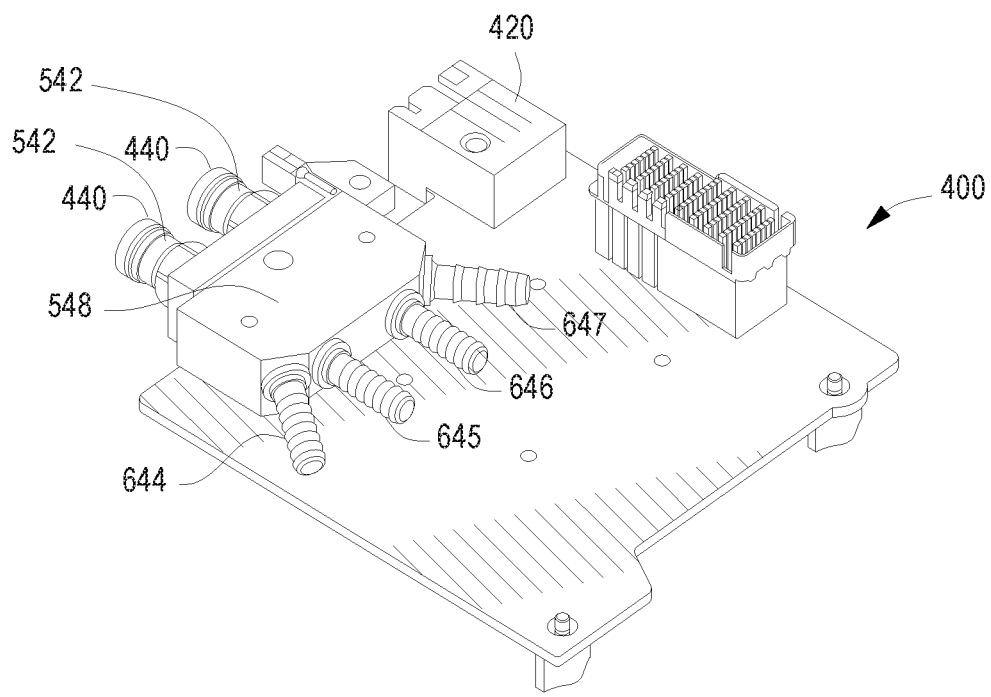
Figure 7:
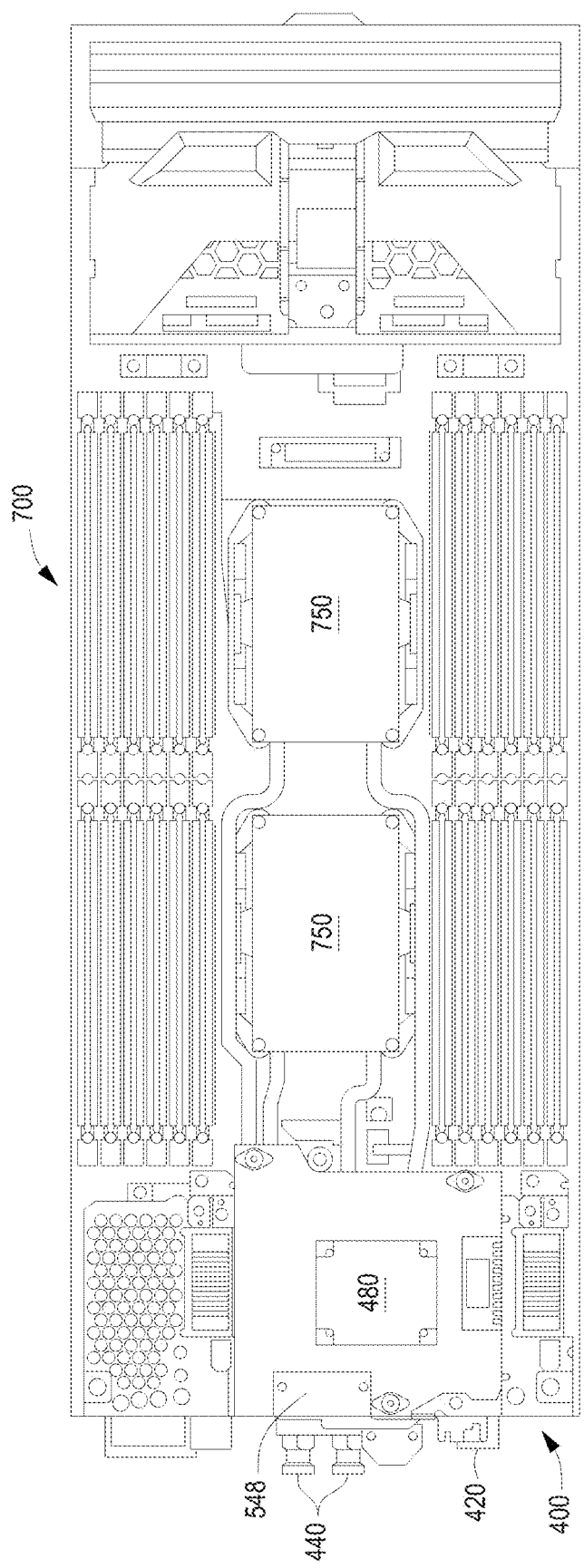
FIG. 7 illustrates a schematic diagram of an add-in card incorporated into an existing form factor according to an example.

FIGS. 5-6 illustrate top and bottom views of an add-in card 400 of FIG. 4 according to examples. FIG. 7 illustrates a schematic diagram of an add-in card 400 incorporated into an existing form factor 700 for blade level flow control according to an example.

The auxiliary power/ground bus bar 420 connection supplies additional power to accommodate the plurality of processors in the node. The liquid cooling connection 440 includes a hot plug connection 542 to connect to the liquid cooling manifold. The liquid cooling connection 440 includes two pairs of fluid connections 644, 645, 646, 647 that can connect to two processors. The two pairs of fluid connections 644-647 each include one supply fluid connection 644, 646 and one return fluid connection 645, 647 for each processor. Each of the supply fluid connections 644, 646 connect to a heat sink 750 on one of the two processors 150. The liquid cooling connection 440 also includes a variable flow valve 548 with two connections to supply fluid connections 644, 645 and return fluid connections 646, 647. The variable rate includes at least three flow rate settings, for example, off, slow flow, and medium flow. The liquid cooling manifold provides fluid to the plurality of processors in parallel or in series depending on the configuration, and the flow to each processor is independent of one another.

The programmable controller 480 is connected to the add-in card. The add-in card 400 with the programmable controller 480 enables configuration allows for scalability to rack with servers to increase liquid cooling capacity per processor. This enables dynamic control and optimizes efficiency.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described may occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be exemplary. Structure and acts described herein are replaceable by equivalents, which perform the same function, even if the structure or acts are different, as known in the art. Therefore, the scope of the present disclosure is limited only by the elements and limitations as used in the claims.

The invention claimed is:

1. A system comprising:
   a base management controller interface connected to a base management controller, the base management controller interface including:
   a power monitoring interface connected to a management software to distribute and monitor additional power to a host server,
   a temperature interface to monitor a temperature of the host server, and
   a flow control interface to control a flow rate of liquid from a liquid cooling manifold;
   a mezzanine connector; and
   a bus bar interface mezzanine connected to the mezzanine connector and a set of processors, the bus bar interface mezzanine includes:
   a power controller interconnect connected to a plurality of power supplies and the mezzanine connector, the power monitoring interface manages the plurality of power supplies,
   a flow controller connected to a supply line and a return line, the flow control interface manages the flow from the supply line and to the return line, and
   a temperature monitor to measure the temperature of the set of processors.

2. The system of claim 1, wherein the flow rate of liquid is selected from at least three flow rates.

3. The system of claim 1, wherein the flow rate is controlled using a variable flow valve.

4. The system of claim 1, wherein the system is scaled to rack level using a set of sensors at each processor of the set of processors.

5. The system of claim 1, wherein the liquid cooling manifold provides liquid to at least two processors.

6. The system of claim 1, wherein the liquid cooling manifold provides liquid to the set of processors in parallel with independent flow control through the flow control interface.

* * * * *